(12) United States Patent
Song et al.

(10) Patent No.: US 9,093,295 B2
(45) Date of Patent: Jul. 28, 2015

(54) EMBEDDED SHEET CAPACITOR

(71) Applicant: QUALCOMM Incorporated, San Diego, CA (US)

(72) Inventors: Young Kyu Song, San Diego, CA (US); Kyu-Pyung Hwang, San Diego, CA (US); Dong Wook Kim, San Diego, CA (US); Changhan Hobie Yun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/079,503

(22) Filed: Nov. 13, 2013

(65) Prior Publication Data

US 2015/0130024 A1        May 14, 2015

(51) Int. Cl.
*H01L 21/02*        (2006.01)
*H01L 27/08*        (2006.01)
*H01L 49/02*        (2006.01)

(52) U.S. Cl.
CPC ............ *H01L 27/0805* (2013.01); *H01L 28/40* (2013.01)

(58) Field of Classification Search
CPC .................... H01L 27/0805; H01L 27/14636; H01L 28/40
USPC .......... 257/532, 734, 686, 774; 438/107, 106, 438/667
See application file for complete search history.

(56) References Cited

U.S. PATENT DOCUMENTS

| | | | |
|---|---|---|---|
| 4,328,530 A | 5/1982 | Bajorek et al. | |
| 5,574,630 A * | 11/1996 | Kresge et al. | 361/792 |
| 5,939,782 A * | 8/1999 | Malladi | 257/698 |
| 6,351,369 B1 * | 2/2002 | Kuroda et al. | 361/306.3 |
| 6,414,835 B1 * | 7/2002 | Wolf et al. | 361/302 |
| 6,532,143 B2 | 3/2003 | Figueroa et al. | |
| 7,149,072 B2 * | 12/2006 | Lee et al. | 361/307 |
| 7,339,798 B2 | 3/2008 | Chakravorty | |
| 7,535,728 B2 * | 5/2009 | Chakravorty et al. | 361/761 |
| 7,621,041 B2 | 11/2009 | Banerji et al. | |
| 2009/0180236 A1 * | 7/2009 | Lee et al. | 361/301.4 |
| 2009/0213526 A1 * | 8/2009 | Hsu et al. | 361/306.1 |
| 2011/0018099 A1 | 1/2011 | Muramatsu | |

* cited by examiner

*Primary Examiner* — Nikolay Yushin
(74) *Attorney, Agent, or Firm* — Haynes and Boone, LLP

(57) ABSTRACT

A multilayer capacitor is provided that includes a plurality of vias configured to receive interconnects from a die.

16 Claims, 11 Drawing Sheets

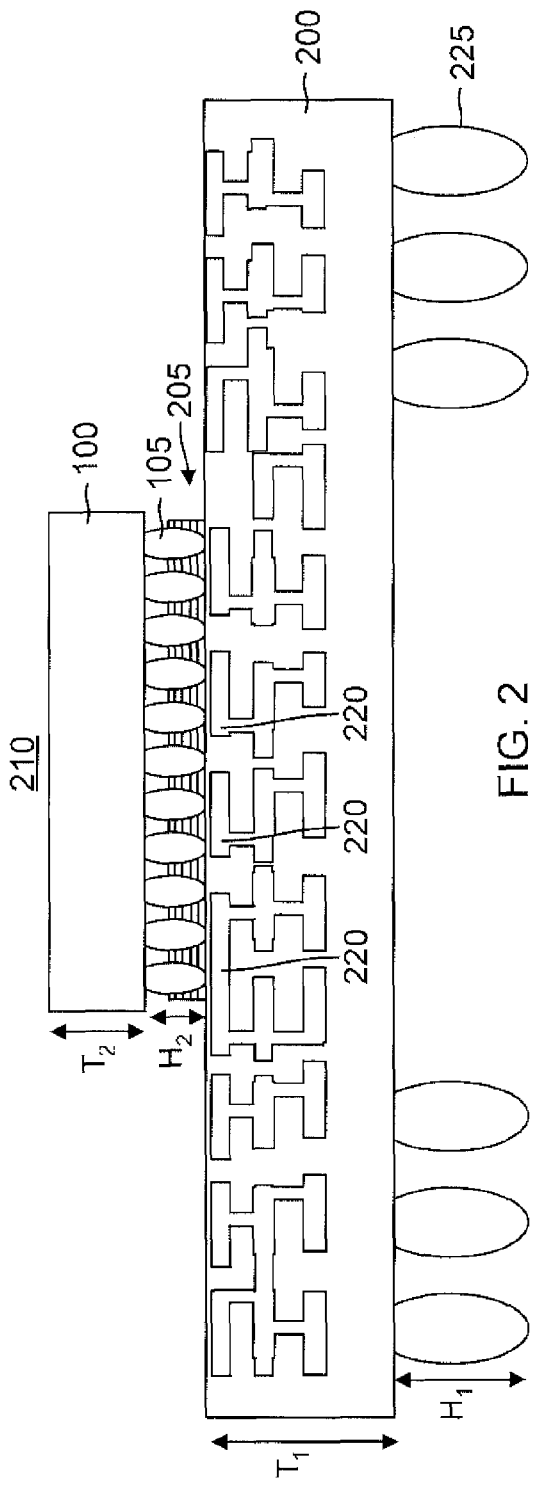
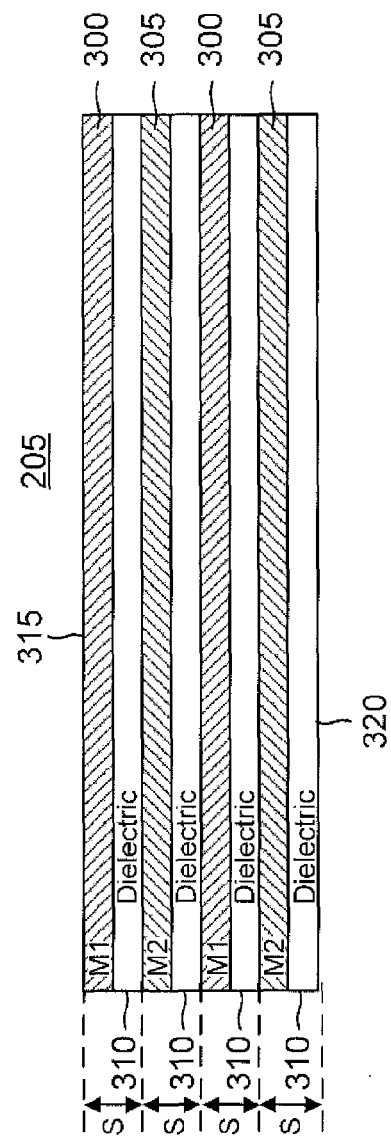
FIG. 2
FIG. 3A

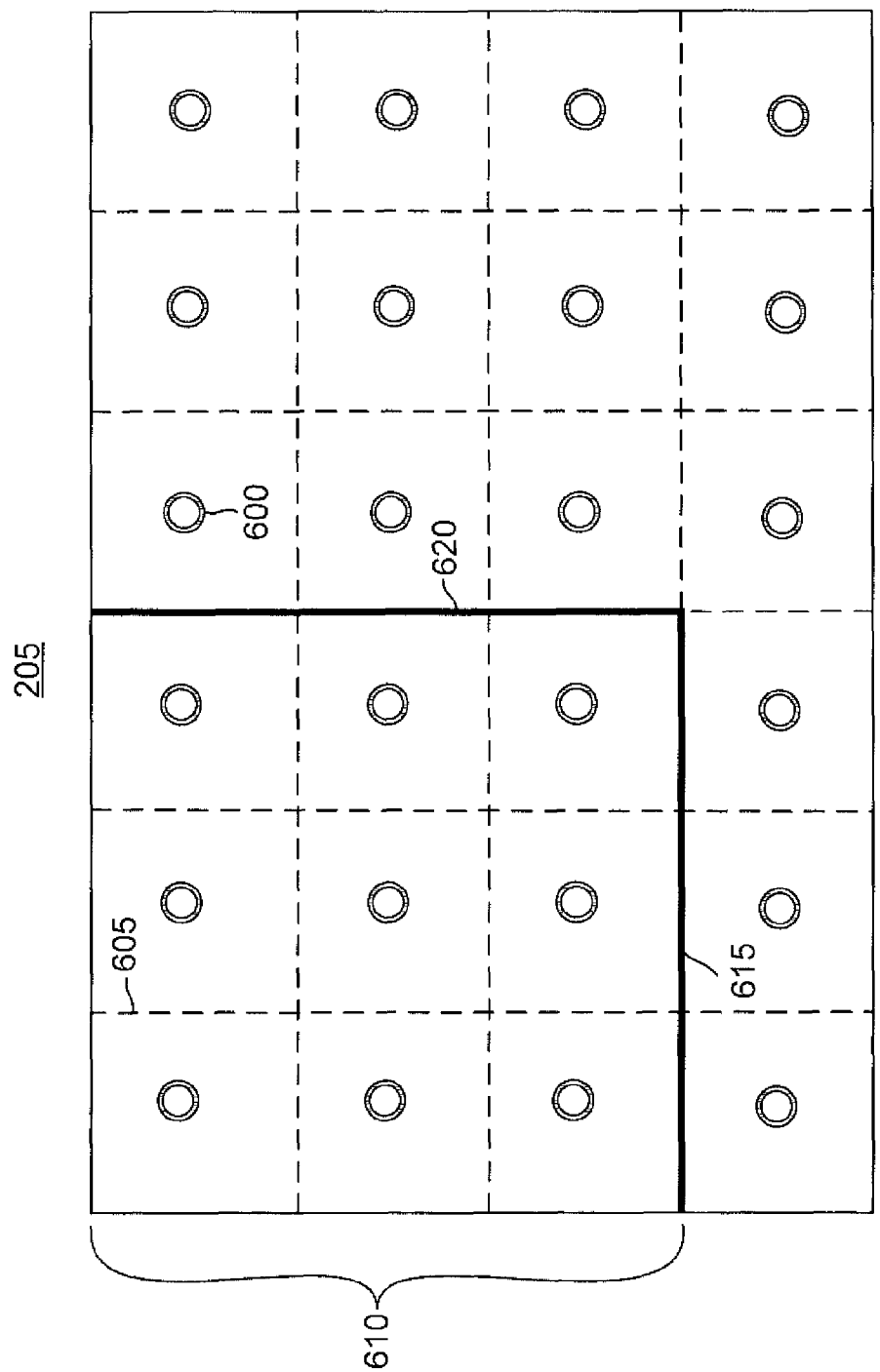

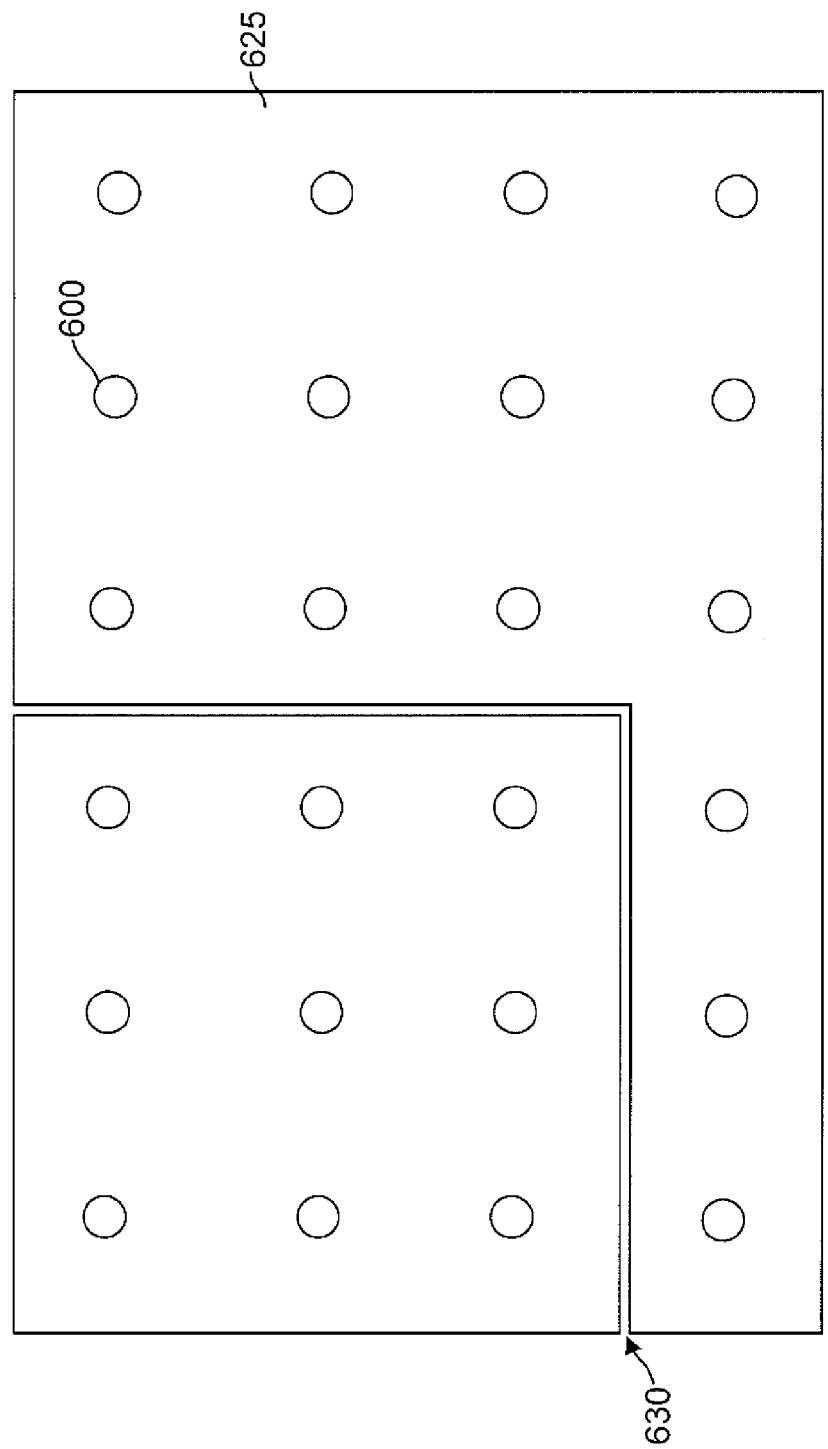

US 9,093,295 B2

EMBEDDED SHEET CAPACITOR

TECHNICAL FIELD

This application relates to embedded passive devices, and more particularly to an embedded capacitor.

BACKGROUND

A digital circuit such as a microprocessor has numerous transistors that alternate between dormant and switching states. Such digital circuits thus make abrupt current demands when large numbers of transistors switch states. But power supplies cannot react so quickly such that the voltage on the power supply lead or interconnect to the die including the digital system may dip unacceptably. To smooth the power demands, it is conventional to load the power supply lead with decoupling capacitors. The decoupling capacitors store charge that may be released during times of high power demand so as to stabilize the power supply voltage.

Decoupling capacitors typically mount to the package substrate or to the circuit board and connect to the die through the power supply and ground interconnects or leads. The interconnect distance between the decoupling capacitor and the die introduces parasitic inductance, which undesirably increases the impedance. In addition, the decoupling capacitors demand valuable package substrate or circuit board space. Integrating the decoupling capacitors into the die itself is also undesirable because the decoupling capacitors will then lower density and increase costs. Alternatively, decoupling capacitors have been formed using film capacitors on an interposer. The die mounts to the interposer, which lessens the parasitic inductance because the decoupling capacitor is then closer to the die. But the capacitance per unit area is too small to make such thin film capacitors an effective alternative. The use of embedded passive capacitors within the package substrate represents another alternative. But the die couples to such embedded passive capacitors with just a pair of vias, which increases the parasitic inductance despite the relative closeness of the embedded passive capacitors. Moreover, the formation of the cavity and embedding of the capacitor into the cavity is relatively expensive and cumbersome.

Accordingly, there is a need in the art improved capacitor designs for power distribution and other applications.

SUMMARY

To provide increased capacitance with reduced parasitic inductance and resistance, a multilayer capacitor is provided that includes a plurality of vias for receiving a corresponding plurality of interconnects from a die. The multilayer capacitor mounts between the die and a substrate. The die couples to the substrate through its interconnects extending through the vias in the multilayer capacitor. The die's interconnects extend through their respective vias in the multilayer capacitor from the die to the substrate. It will thus be appreciated that the multilayer capacitor occupies the space between the die interconnects after the die is surface mounted to the substrate. In other words, the die interconnects have some stand-off height after the die is surface mounted through the vias in the multilayer capacitor and the resulting combination of die, multilayer capacitor, and substrate reflowed. This stand-off height is the separation between the die and the package substrate after reflow. In one embodiment, the multilayer capacitor has a thickness that is equal to or less than the stand-off height established by the die interconnect. This is quite advantageous because the multilayer capacitor then contributes no factor to the overall package height. In addition, the space between the die interconnects after reflow would conventionally be filled with underfill material and thus provide no benefit. The multilayer capacitor advantageously occupies this otherwise-wasted space, which is quite advantageous as it enhances density.

BRIEF DESCRIPTION OF THE DRAWINGS

FIG. 2 is a cross-sectional view of the die of FIG. 1 surface mounted to a substrate through a multilayer capacitor in accordance with an embodiment of the disclosure.

FIG. 3A is a cross-sectional view of the multilayer capacitor of FIG. 2.

FIG. 6A is a conceptual diagram illustrating the metal layer isolation of a portion of a multilayer capacitor from a remaining portion.

FIG. 6B is a plan view of a metal layer from the multilayer capacitor of FIG. 6A.

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
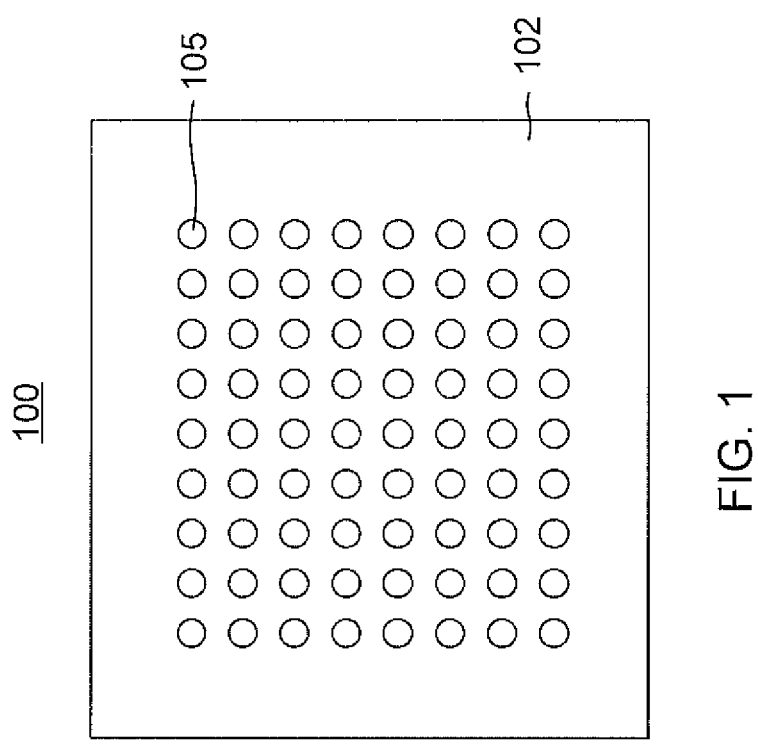
FIG. 1 is a plan view of a view of an active surface of a die and its corresponding array of interconnects.

To reduce parasitic inductance, lower costs, and increase density, a multilayer capacitor is provided on a die-facing surface of a substrate. A die mount to the die-facing surface of the substrate through interconnects such as bumps or copper pillars. The die interconnects are received by the vias in the multilayer capacitor. In this fashion, the die interconnects couple through the multilayer capacitor to the substrate. The substrate includes a plurality of pads or other suitable structures such as solder-on-pads to receive the die interconnects. In a surface-mount packaging, the die interconnects are reflowed to couple to the substrate pads. This is quite advantageous as the placement of the die onto the substrate prior to reflow may occur using, for example, conventional pick-and-place operations. Moreover, the die interconnects are received by the vias in the multilayer capacitor, which intervenes between the die and substrate.

The multilayer capacitor thus occupies the space between the die interconnects that would otherwise be filled with underfill material in a conventional surface mounting of the die onto the substrate. For example, a typical standoff height for a die interconnect such as a micro-bump or copper pillar after reflow may be 100 microns or greater. This standoff height for the die interconnects establishes the standoff separation between the die and the package substrate after reflow. In one embodiment, the multi layer capacitor has a thickness that is less than or equal to the standoff height. Such a multilayer capacitor embodiment thus provides no contribution to the standoff separation between the die and the substrate, which minimizes the overall package height after reflow and thus increase density. Moreover, the multilayer capacitor occupies the space between the die interconnects, the die, and the substrate that would otherwise be filled with underfill material in a conventional surface mount process. This is quite advantageous as the multilayer capacitor requires no extra space outside of the die footprint on the substrate. In contrast, a conventional surface-mount capacitor on the substrate requires the substrate footprint to be larger so it can receive both the die and the surface-mount capacitor. In contrast, the substrate disclosed herein need only have a footprint sufficient to receive the die since the multilayer capacitor intervenes between the die and the substrate in the space that would otherwise just be filled with underfill material in a conventional surface mount process.

Note that the die interconnect density for applications such as flip-chip, wafer-level packaging, and chip-scale level packaging may be relatively low. For example, the die interconnect density for the die footprint on the substrate may be around 10%. This leaves 90% of the die footprint on the substrate for the multilayer capacitor such that the multilayer capacitor can offer significant amounts of capacitance in a relatively-small footprint. Since the multilayer capacitor is thus very close to the die, the parasitic inductance is greatly lowered as compared to conventional board-mounted or substrate-mounted bypass capacitor locations. In addition, the capacitance of the multilayer capacitor is relatively high because it comprises a plurality of metal layers. In this fashion, other board-mounted or die-mounted capacitors such as decoupling capacitors may be reduced or eliminated, which further enhances density and lowers costs. Moreover, the multilayer capacitor is significantly less expensive to produce than conventional cavity-embedded capacitors.

Example Embodiments

To better appreciate the novel features of the multilayer capacitor disclosed herein, an active surface 102 of an example die 100 is shown in FIG. 1. Active surface 102 defines the footprint of die 100 after it surface mounts to a substrate (not illustrated) such as a package substrate, a circuit board, or an interposer through a plurality of interconnects 105. The concepts and features disclosed herein are widely applicable to any suitable die interconnect technology such as controlled collapse interconnect (C4), copper pillars, solder bumps, and so on. Regardless of the interconnect technology used in a particular embodiment, it can be immediately appreciated that the area of active surface 102 is considerably greater than that occupied by interconnects 105. As noted earlier, interconnects 105 may occupy approximately 10% or less than the total available die footprint. In a conventional surface-mounted die such as a flip-chip die, an underfill material fills the unoccupied space between interconnects 105 after die 100 mounts to a substrate. But the multilayer capacitor disclosed herein occupies all or a portion of this conventionally-unoccupied space between a surface-mounted die and its substrate.

FIG. 2 shows a cross-sectional view of die 100 mounted to a substrate 200 through interconnects 105 to form an integrated circuit package 210. In this embodiment, substrate 200 comprises an organic laminate package substrate but it will be appreciated that a wide variety of other types of substrates may receive die 100 and a multilayer capacitor 205 in alternative embodiments such as glass substrates, semiconductor substrates, interposers, and circuit boards. Interconnects 105 couple to corresponding pads 220 on substrate 200 through vias in multilayer capacitor 205. Substrate 200 mounts to a board (or other substrate) through interconnects 225 such as solder balls. After reflow, integrated circuit package 210 has a height that equals a sum of a height $H_1$ for interconnects 225, a thickness $T_1$ for substrate 200, a height $H_2$ for interconnects 105, and a thickness $T_2$ for die 100.

The height $H_2$ equals the standoff separation between die 100 and substrate 200 after reflow. This standoff separation or height depends upon the interconnect technology. For example, if interconnects 105 comprise copper pillars, the standoff height may be approximately 100 microns. Regardless of the particular standoff height for a particular interconnect technology, multilayer capacitor 205 may have a thickness that is less than or equal to the standoff height in some embodiments. This is quite advantageous because multilayer capacitor 205 would thus provide no contribution to the overall height for package 210 in such embodiments, which increases density. In addition, since die 100 couples to multilayer capacitor 205 through its interconnects 105, the parasitic inductance is sharply reduced as compared to a conventional surface-mount capacitor coupling to die 100. In particular, note that interconnects 105 provide the shortest possible electrical paths to die 105 absent an integration onto die 105 itself. But integration on die 105 is expensive and offers relatively little capacitance. Thus, it is cheaper and more effective to use external capacitors such as a surface mount (SMT) capacitor on substrate 200. But such an external capacitor couples to die 100 through leads on substrate 200, which introduce parasitic inductance and resistance. In sharp contrast, there are no such leads for multilayer capacitor 205 as it couples directly to die 100 through interconnects 105. In addition, note that any capacitor has a positive terminal and a negative terminal so as to function as a capacitor. As will be explained further below, a first plurality of interconnects 105 function as the positive terminal for multilayer capacitor 205 whereas a second plurality of interconnects 105 function as the negative terminal for multilayer capacitor 205. This is quite advantageous as compared to the use of conventional embedded capacitors in substrate 200, which couple only through a single positive terminal and a single negative terminal to die 100. The plurality of positive and negative terminals for multilayer capacitor 205 further reduces parasitic inductance and resistance as compared to such two-terminal embedded capacitors.

Multilayer capacitor 205 enhances density regardless of whether it has a thickness that is less than the standoff height between die 100 and substrate 200 since multilayer capacitor 205 occupies the die footprint that would otherwise be filled with conventional underfill material. Multilayer capacitor 205 thus needs no additional package substrate space or circuit board space. In addition, die 100 is freed from the need to include any integrated bypass capacitors. Furthermore, the resulting system need not use expensive alternatives such as embedding a capacitor in a cavity within the core of substrate 200.

The following discussion is directed to a multilayer ceramic capacitor (MLCC) embodiment for multilayer capacitor 205. Low-profile MLCC in one type of multilayer capacitor technology in which manufacturing costs are relatively low. However, other dielectric materials may be used in alternative embodiments for multilayer capacitor 205. But to maximize capacitance, the dielectric material used herein may have a dielectric constant of 100 or greater, or even 1000 and greater in some embodiments. A multilayer ceramic capacitor readily satisfies such a dielectric constant goal. This high dielectric constant as well as multiple metal layer construction thus achieves high capacitance in a relatively small footprint. In addition, the following discussion is directed to a bypass capacitor implementation. But it will be appreciated that the concepts and features disclosed herein are widely applicable to the implementation of other types of capacitors such as used in RF frontends in addition to bypass capacitors.

The multiple metal layers of multilayer capacitor 205 are shown in more detail in FIG. 3A. Multilayer capacitor 205 includes a plurality of M1 metal layers 300 interleaved with a plurality of M2 metal layers 305. Dielectric layers 310 interleave with the M1 and M2 metal layers to insulate and separate them. Because of the interleaving, the M1 and M2 metal layers alternate in multilayer capacitor 205. A dielectric layer 310 intervenes between each consecutive M1 and M2 metal layer alternation. The M1 and M2 metal layers may all comprise the same type of metal and layer thickness. For example, the M1 and M2 metal layers may comprise copper, nickel, cobalt, gold, or other suitable metals. In addition, the M1 and M2 metal layers may range in thickness from a fraction of a micron (e.g., 0.7 micron) to tens of microns in thickness. In this embodiment, there are two M1 metal layers 300 and two M2 metal layers 305. However, it will be appreciated that additional M1 and M2 metal layers may be used in alternative embodiments. For example, in some embodiments, a typical standoff height or separation between a surface-mounted die and its substrate is approximately 90 to 100 microns. A multilayer capacitor 205 that has a thickness less than the die standoff height would then have to be 100 microns in thickness or less for such an embodiment. A multi layer capacitor 205 embodiment in which each dielectric layer 310 is a few microns in thickness and each M1 and M2 metal layer is approximately a micron in thickness could include over a dozen M1 and M2 metal layers. Such a multiplicity of M1 and M2 metal layers provides significant capacitance in a compact footprint. In general, the number of metal layers is a design choice that may be based upon a number of factors such as the desired capacitance as well as the cost of the resulting multilayered capacitor. The thickness of each metal layer as well as the dielectric layer thickness is also an analogous design choice.

Because of the interleaving of the M1 and M2 metal layers, each M1 metal layer 300 is adjacent a neighboring M2 metal layer 305. A dielectric layer 310 insulates each M1 metal layer 300 from the adjacent M2 layers 305. As will be explained further herein, it is convenient to manufacture multilayer capacitor 205 by initially depositing a metal layer onto a dielectric layer to form a metal-layer/dielectric layer film. This film may then be stacked and cut into suitable portions to form a plurality of multilayer capacitors 205. The resulting stacking of the starting film forms layers of thickness S in multilayer capacitor 205 as shown in FIG. 3A. Since the starting film is a dielectric layer coated with a metal layer, each layer S comprises a metal layer (either metal layer M1 300 or metal layer M2 305) and a dielectric layer 310.

Referring again to FIG. 1, a portion of interconnects 105 are ground interconnects whereas another portion of interconnects 105 couple the power supply voltage (VDD) to die 100. In addition, a remaining portion of interconnects 105 supply signals to die 105. These various interconnect portions are shown conceptually in FIG. 3B. A ground portion 330 of interconnects 105 are the ground interconnects. Similarly, a power supply voltage (VDD) portion 335 of interconnects 105 are the power supply interconnects. For illustration clarity, interconnects 105 in portions 330 and 335 are shown spaced apart from multilayer capacitor 205 in FIG. 3B. However, as shown in FIG. 2 and explained further herein, each interconnect 105 actually transects through multilayer capacitor 205 in a corresponding via. Given this organization, multilayer capacitor 205 functions as a decoupling capacitor if all the metal layers of one type (M1 or M2) couple to interconnects 105 in ground portion 330 whereas all the metal layers of the remaining metal layer type (M2 or M1) couple to interconnects 105 in VDD portion 335. It is arbitrary what metal layer type couples to VDD or ground. In the embodiment shown in FIG. 3B, the M2 metal layers 305 couple to interconnects 105 in ground portion 330 whereas the M1 metal layers 300 couple to interconnects 105 in VDD portion 335.

In one embodiment, the M1 and M2 metal layers comprise a means for storing positive and negative charge in multilayer capacitor 205. In this means, one of the metal layer classes (either M1 or M2) functions to store the positive charge whereas a remaining metal layer class functions to store the negative charge.

A remaining signal portion 340 of interconnects 105 function to couple signals to die 105 and thus do not have any coupling to the M1 and M2 metal layers. The positive terminals for multilayer capacitor 205 thus comprise interconnects 105 in power supply portion 335 whereas the negative terminals for multilayer capacitor 205 comprise interconnects 105 in ground portion 330.

Each interconnect 105 is received in a corresponding via in multilayer capacitor 205. These vias (not illustrated) would extend from a die-facing surface 315 of multi-layer 205 to an opposing surface 320. To enable the selective coupling of the appropriate metal layer type (M1 or M2) to interconnects 105 in the corresponding ground portion 330 or power supply portion 335, the M1 and M2 metal layers are configured to include a plurality of members or ribs that selectively extend into appropriate ones of the vias. In one embodiment, the M2 metal layers 305 may thus include members that extend into the vias receiving interconnects 105 in ground portion 330. Similarly, the M1 metal layers 300 may include members or ribs that extend into the vias receiving interconnects 105 in power supply portion 335.

Figure 3B:
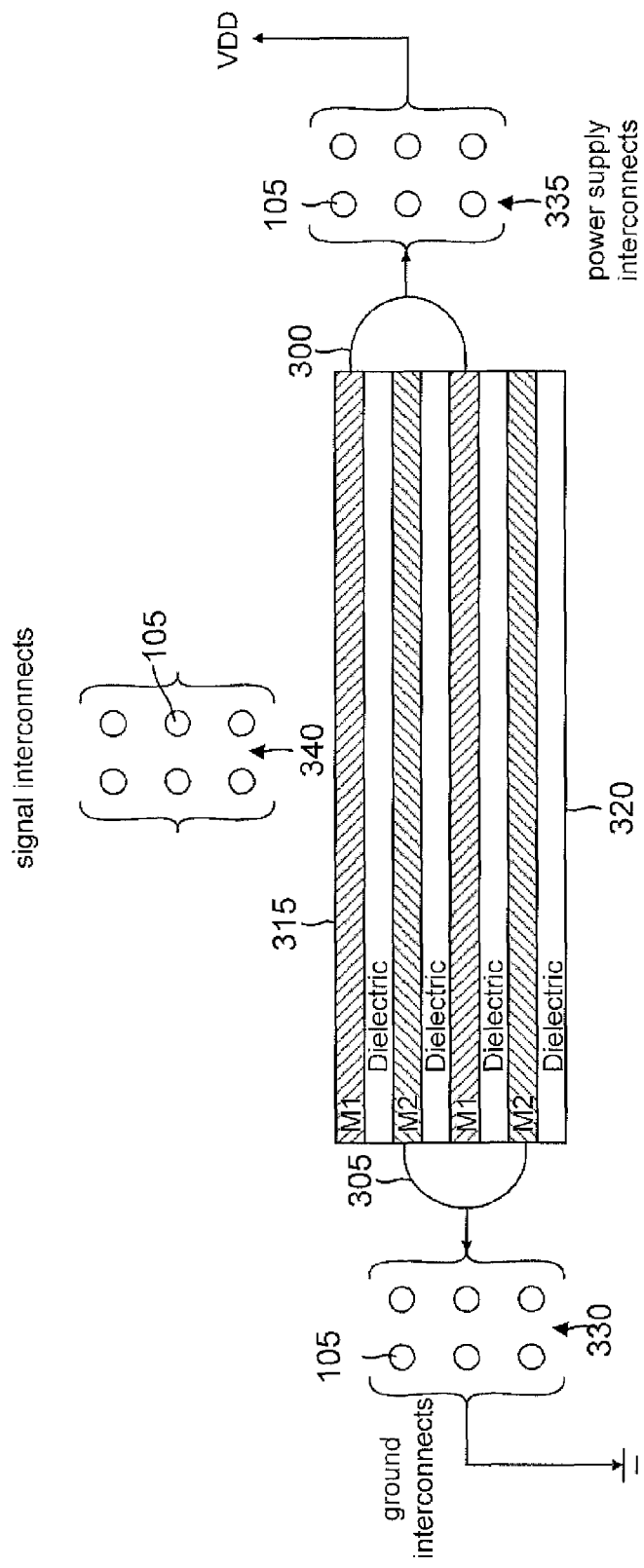
FIG. 3B is a conceptual diagram illustrating the metal-layer-to-interconnect couplings for the multilayer capacitor of FIG. 3A.
Figure 4:
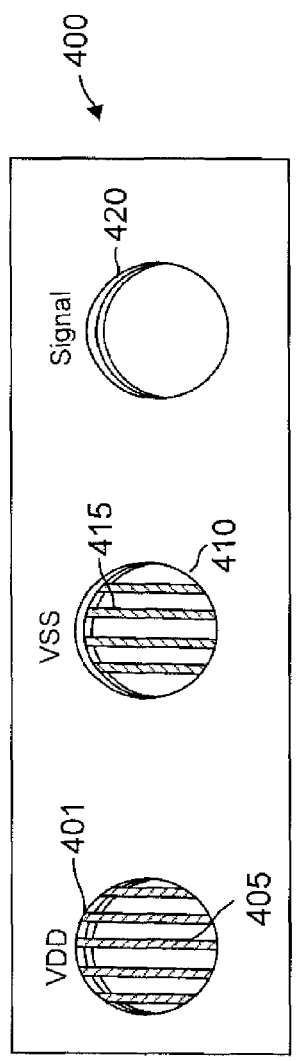
FIG. 4 illustrates a plan view of a portion of the multilayer capacitor of FIG. 3A that includes a power supply via, a ground via, and a signal via.

Some example vias are shown in FIG. 4 for a portion 400 of multilayer capacitor 205. A power supply via 401 extends completely through the M2 metal layers 305 and dielectric layers 310 shown in FIG. 3A. In that regard, power supply via 401 may be denoted as an "open" via in that free space extends completely through multilayer capacitor 205 in power supply via 401. In that regard, the term "via" is used in several ways in the integrated circuit arts. For example, it is often used to refer to a metallic connection that extends through a layered structure. But it is also used to refer to the hole or opening in the layered structure that will eventually receive such a metallic connection. Power supply via 401 is an example of such a hole or opening. But the M1 metal layers 300 surrounding power supply via 401 are patterned to include a plurality of ribs 405 that span across or project into power supply via 401. The M1 metal layers 300 will thus couple to the interconnect 105 (a member of power supply portion 335 shown in FIG. 3B) that will eventually be received in power supply via 401. In this fashion, the M1 metal layers 300 function to store positive charge in multilayer capacitor 205 so that the interconnect 105 that will eventually be received in power supply via 401 functions as one of the positive terminals for multilayer capacitor 205. All the remaining interconnects 105 in power supply portion 335 of FIG. 3B are received in corresponding power supply vias that are intersected by ribs 405 from M1 metal layers 300 in this fashion.

The M2 metal layers 305 serve to store negative charge in one embodiment of multilayer capacitor 205 and couple to an interconnect 105 that will be received in a ground supply via 410 from ground supply interconnect portion 330. Like power supply via 401, ground supply via 410 may also be deemed to comprise an "open" via in that free space extends completely through via 410. M2 metal layers 305 include one or more ribs 415 that span across ground supply via 410. All the remaining interconnects 105 in ground supply portion 330 of FIG. 3B are received in corresponding ground supply vias 410 that are intersected by ribs 415 from M2 metal layers 305. Interconnects 105 in ground supply portion 330 thus function as the negative terminals for multilayer capacitor 205. It will be appreciated, however, that the charge assignment of the M1 and M2 metal layers is arbitrary. In an alternative embodiment, the M2 metal layers 305 may serve to store positive charge whereas the M1 metal layers 300 may serve to store negative charge. In that regard, the "M1" and "M2" designations should not be understood to refer to any particular order of the corresponding metal layers. Instead, "M1" refers to that class of metal layers that couple to one class of terminals (either positive or negative) whereas "M2" refers to a remaining class of metal layers that couple to a remaining class of terminals.

A decoupling capacitor may be isolated from the signals driven into a die. To provide this isolation, each interconnect 105 in signal portion 340 of FIG. 3B is received in a corresponding signal via such as a signal via 420 shown in FIG. 4. Signal via 420 is also an "open" via in that free space extends completely through multilayer capacitor 205 in signal via 420. None of the metal layers M1 300 nor any of the metal layers M2 305 include any ribs or members for coupling to the interconnects 105 that will eventually be received in signal vias 420. In this fashion, signals carried on interconnects 105 in signal portion 340 are not affected by the capacitance from multilayer capacitor 205. Some example methods of manufacture for the construction of package 210 as well as multilayer capacitor 205 will now be discussed.

Example Methods of Manufacture

Figure 5A:
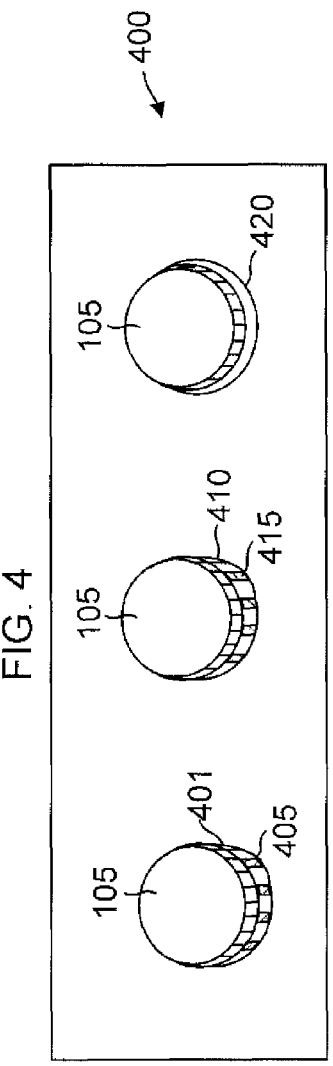
FIG. 5A illustrates the vias of FIG. 4 about to receive corresponding interconnects.

The attachment of die 100 to substrate 200 through multilayer capacitor 205 to form package 210 of FIG. 2 will be discussed first followed by a discussion of the manufacture of multilayer capacitor 205. Multilayer capacitor 205 may be attached to a die-facing surface of substrate 200 such that its vias align appropriately with corresponding substrate pads 220. Any suitable adhesive may be used to attach multilayer capacitor 205 to substrate 200 in this fashion. Die 100 may then be positioned so that its interconnects 105 align with the corresponding substrate pads 220 on substrate 200. In this alignment, interconnects 105 must first extend through their corresponding vias in multilayer capacitor 205 before they can couple to corresponding substrate pads 220. Multilayer capacitor 205 would thus be aligned prior to its attachment to substrate 200 so that its vias 401, 415, and 420 are centered with the corresponding pads 220. Vias 401, 415, and 420 may then each receive the corresponding interconnect 105 from die 100. An example initial placement of interconnects 105 into vias 401, 415, and 420 for multilayer capacitor portion 400 is shown in FIG. 5A. For illustration clarity, a corresponding portion of die 100 is not shown in FIG. 5A but it would be attached to interconnects 105 while vias 401, 415, and 420 receive their corresponding interconnect 105. Die 100 would thus be aligned so that its interconnects 105 are partially received in vias 401, 410, and 420. As discussed previously, interconnects 105 may comprise a wide variety of interconnects such as solder bumps or copper pillars. But even non-solder interconnects such as copper pillars are tipped with solder caps. Upon initial placement as shown in FIG. 5A, the interconnects 105 have no molten solder (neither in solder caps nor in the entire interconnect portion in the case of solder bumps) such that they cannot pass fully through power supply vias 401 and ground vias 410 due to the projection from members 405 and 415.

Figure 5B:
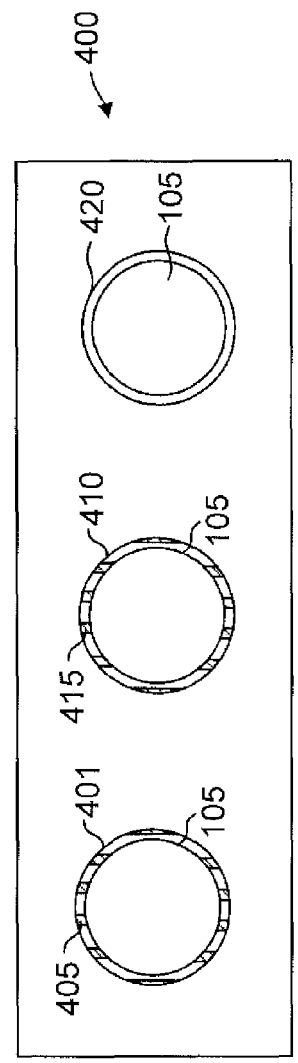
FIG. 5B illustrates the vias of FIG. 5A after reflow such that the corresponding interconnects are fully received in their respective vias.

A reflow process then allows the solder associated with interconnects 105 to melt so as to flow about members 405 and 415 and be fully received within vias 401, 410, and 420 as shown in FIG. 5B. The diameter of power supply via 401 may be sufficiently wider than a diameter of the interconnect 105 that it receives so as to prevent interconnect 105 from shorting undesirably to the M2 metal layers (not illustrated). To assist in the insulation of the M2 metal layers, power supply via 401 may be lined with a passivation or dielectric material (not illustrated). Because members 405 from the M1 metal layers extend into power supply via 401, members 405 project into the interconnect 105 received in power supply via 401 and thus couple this interconnect 105 to the M1 metal layers (not illustrated). It will be appreciated that the shape of members 405 is somewhat arbitrary in that members 405 need not fully span across power supply via 401. Indeed, it may be advantageous to include members that only project partially into power supply via 401 instead of fully spanning its width in alternative embodiments as such partial projection would interfere less with the descent of interconnect 105 into via 401 during reflow as it is fully received within power supply via 401. The geometry or shape of members 405 is thus a tradeoff between ease of their construction, assurance of an electrical connection to interconnect 105, and the ease for which interconnect 105 reflows and is received within power supply via 401 despite the mechanical interference from projecting members 405.

The same factors discussed with regard to power supply via 401 apply analogously to ground via 410 receiving an interconnect 105 after reflow as shown in FIG. 5B. Thus, ground via 410 may have a width sufficiently greater than a width of the interconnect 105 that it receives to prevent the received interconnect 105 from shorting to metal layers M1. In addition, ground via 410 may be lined with a passivation or dielectric lining (not illustrated) to assist in the isolation of metal layers M1 from the interconnect 105 received in ground via 410. Members 415 from metal layers M2 intersect with the interconnect 105 received in ground via 410 to couple ground interconnect 505 to the metal layers M2 (not illustrated). Signal via 420 also receives its interconnect 105 after reflow. But no members project into the interconnect 105 received in signal via 420 as discussed with regard to FIG. 4.

A cross-sectional plan view of multilayer capacitor 205 after reflow is shown in FIG. 6A. Since the location of a power supply via 401, ground via 410, and signal via 420 depends upon the particular die being addressed, these vias are referred to generically in FIG. 6A as vias 600. In this embodiment, vias 600 are distributed in a row and column fashion. Regardless of the actual via distribution, it is advantageous in some embodiments to customize the capacitance offered by multilayer capacitor 205. For example, in the row and column grid of vias 600, multilayer capacitor 205 may be deemed to comprise blocks 605 corresponding to the rows and column arrangement of vias 600. Each block 605 comprises a rectangular portion of multilayer capacitor 205 about a corresponding via 600. A plurality of blocks 605 forming a portion 610 of MLCC 205 may be electrically isolated from a remaining portion of multilayer capacitor 205 to provide the desired amount of capacitance. For example, suppose the M1 and M2 metal layers were formed so as to be absent in a trench represented by lines 615 and 620. But the dielectric layers would span across lines 615 and 620 to maintain mechanical integrity for multilayer capacitor 205. It will be appreciated that blocks 605 are conceptual devices in that no such physical distinction exists in multilayer capacitor 205. Blocks 605 thus represent borders in which the M1 and M2 metal layers may be divided through corresponding trenches. An example trenched metal layer (either metal layer M1 or metal layer M2) is shown in FIG. 6B having a trench 630 to electrically isolate portion 610 of FIG. 6A. Vias 600 within portion 610 could thus include the necessary number of power supply and ground vias to capacitively charge the M1 and M2 metal layers within portion 610. But the remainder of multilayer capacitor 205 would not contribute to this resulting capacitance for portion 610. In this fashion, a user may customize multilayer capacitor 205 to provide the desired amount of capacitance. Moreover, multiple portions of multilayer capacitor 205 may be used to provide multiple capacitances. Regardless of whether a portion or the entirety of multilayer capacitor 205 is used in this fashion, the resulting capacitance is located no more than an interconnect 105 height after reflow away from die 100 as discussed with regard to FIG. 2. This is quite advantageous because the parasitic inductance is thus sharply reduced as compared to the use of board or package-substrate mounted bypass capacitor.

Figure 7A:
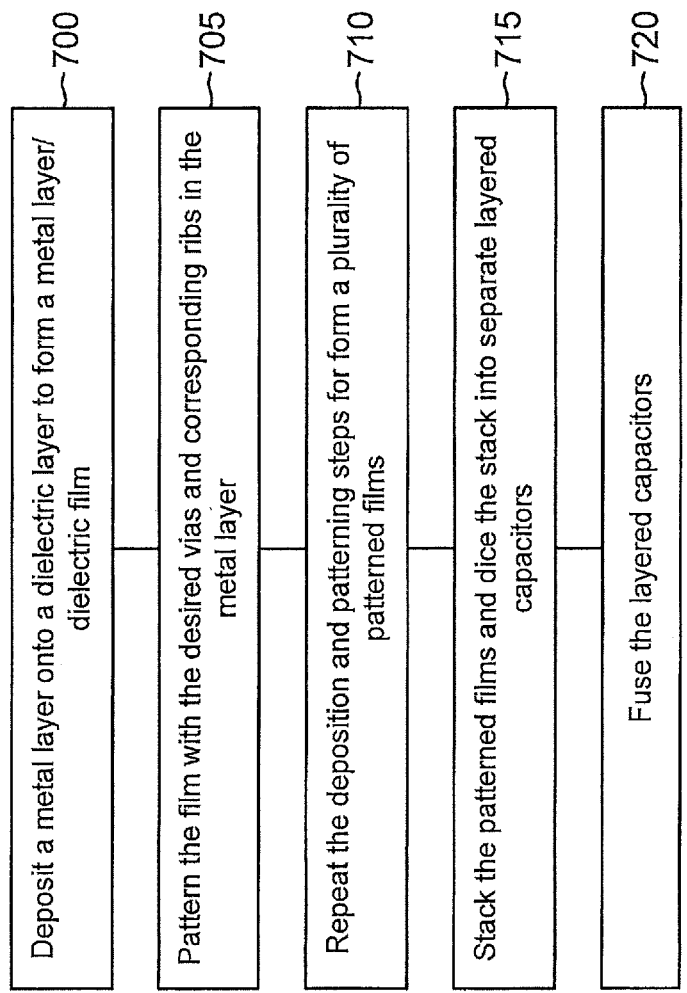
FIG. 7A is a flowchart for a method of manufacturing a multilayer capacitor in accordance with an embodiment of the disclosure.

An example method of manufacture will now be discussed with regard to the flowchart shown in FIG. 7A. This method of manufacture is directed to a ceramic layer embodiment but it will be appreciated that it may readily be adapted to the manufacture of a multilayer capacitor using other suitable dielectric materials to form the dielectric layers. In a step 700, a metal layer is deposited onto a dielectric layer to form a metal layer/dielectric layer film. In the multilayer ceramic capacitor arts, the dielectric layer is typically denoted as "green tape" and would comprise a high-K dielectric such as powdered barium titanate mixed with an organic binder. However, other powdered ceramics may be used in alternative embodiments. The thickness of the dielectric layer determines the separation between the resulting M1 and M2 metal layers. For example, in one embodiment the starting dielectric layer may have a thickness of a few microns. In alternative embodiments, the starting dielectric layer may be thicker such as 20 microns. Prior to the deposition of a metal layer, the starting dielectric layer may be patterned to form vias that will eventually be part of vias 401, 410, and 420 shown in FIGS. 4 through 5B. The deposition of the metal layer onto the patterned dielectric layer may be performed using electroplating such as by plating copper. Alternatively, other metals such as nickel or gold may be used to form the deposited metal layer. The metal layer thickness may range from several microns to more than 10 microns. The resulting metal layer/dielectric layer film is represented by each layer S shown in FIG. 3B.

Figure 7B:
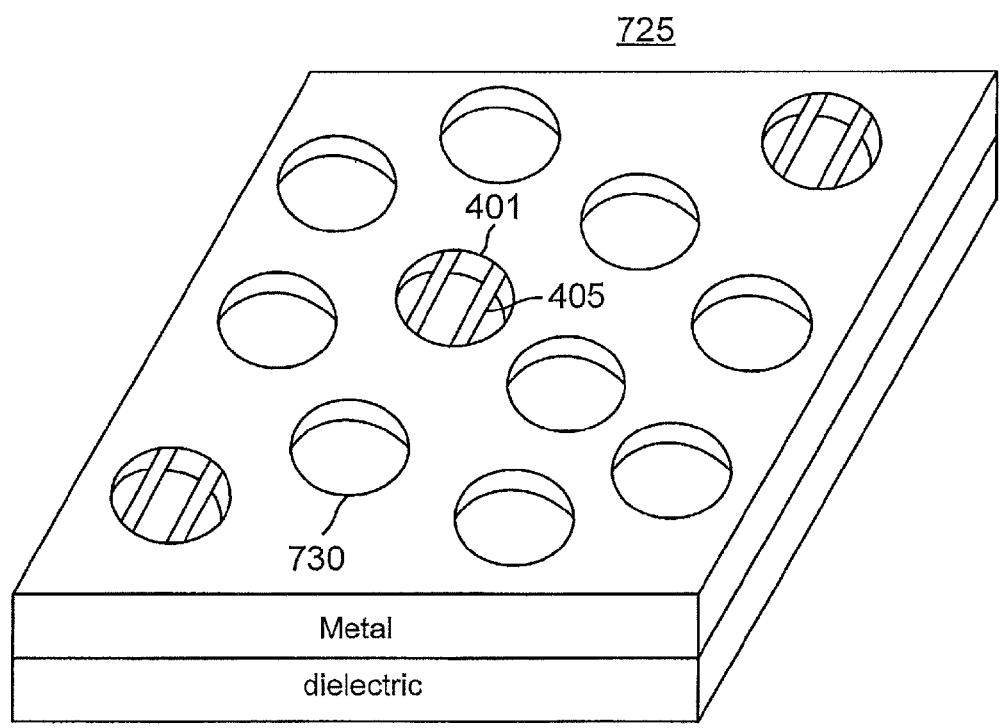
FIG. 7B illustrates a patterned film from the method of FIG. 7A for a first metal layer.
Figure 7C:
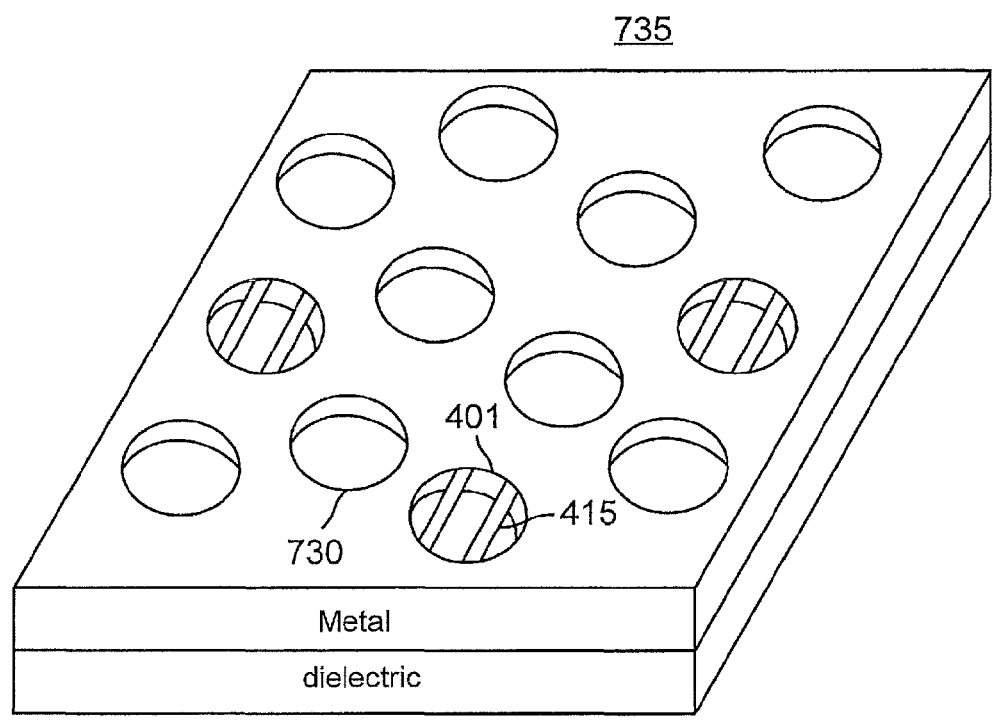
FIG. 7C illustrates a patterned film for the method of FIG. 7A for a second metal layer.
Figure 7D:
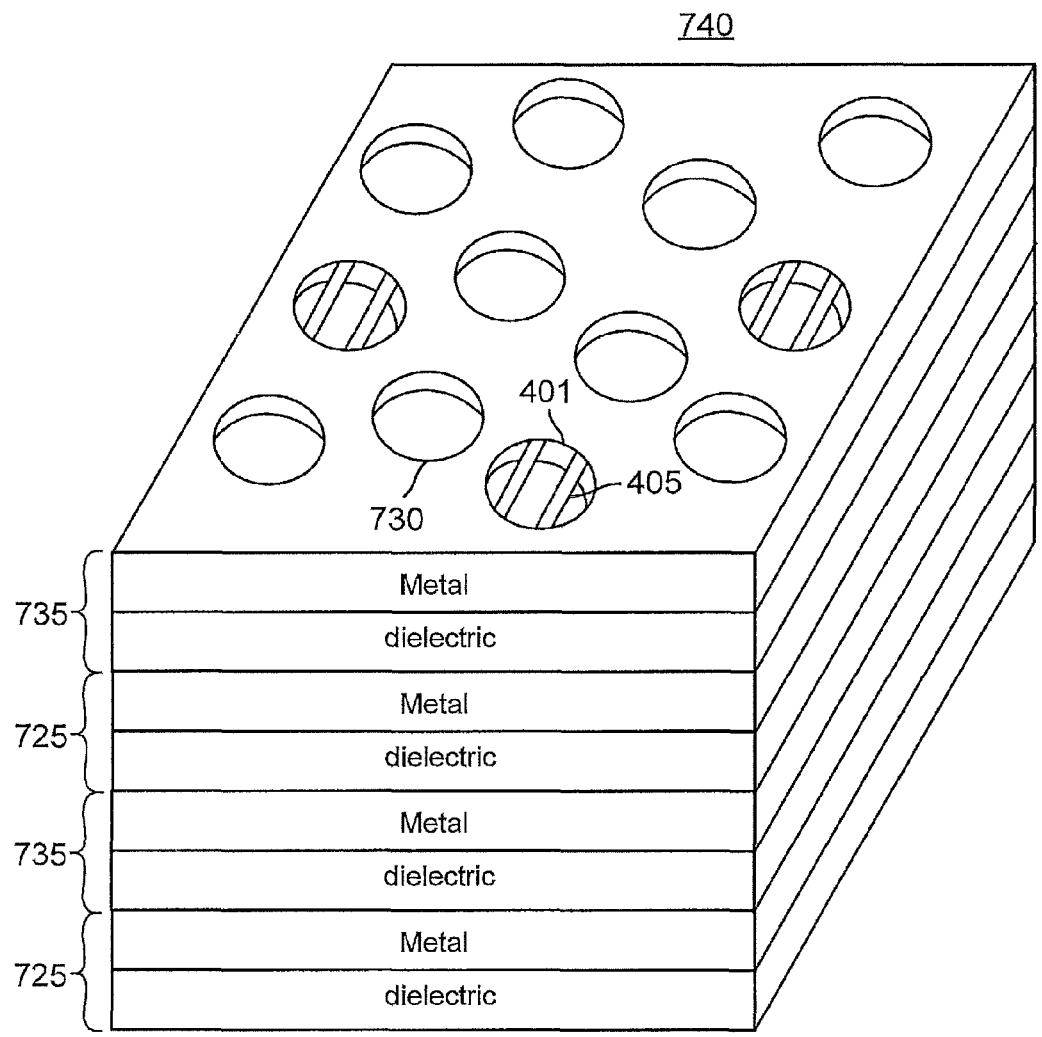
FIG. 7D illustrates an alternating stack of the patterned films from the method of FIG. 7A.

In a step 705, the metal layer/dielectric layer film formed in step 700 is patterned to form the desired vias and corresponding ribs in the metal layer. For example, a mask layer may be deposited over the metal layer and patterned using photolithography. The film may then be etched through the patterned mask layer to form the appropriate vias in the metal layer as well as the corresponding ribs or members in the metal layer. Referring again to FIG. 4, the patterning of the film depends upon whether the resulting metal layer will become one of the M1 metal layers 300 or one of the M2 metal layers 305. In both cases, the signal vias 420 are the same but patterning of members 405 in what will become the power supply vias 401 depends upon whether the metal layer will become an M1 metal layer. If the metal layer will become an M2 metal layer, no members 405 would be formed in what will become the power supply vias 401. Similarly, if the metal layer will become an M1 metal layer, no members 415 would be formed in what will become the ground vias 410. An example patterned film 725 is shown in FIG. 7B. For illustration clarity, only a few example vias 730 are shown. Film 725 is patterned according to the M1 metal layer patterning so as to form a plurality of power supply vias 401 including ribs 405 as discussed with regard to FIG. 4. As shown in FIG. 7C, another film 735 is patterned according to the M2 metal layer patterning so as to form a plurality of ground vias 410 including ribs 415.

Referring again to FIG. 7A, the deposition and patterning of steps 700 and 705 are repeated in a step 710 so as to form a plurality of patterned films 725 and 735. In a step 715, the resulting patterned films are stacked in an alternating or interleaved fashion such that their vias align appropriately and then diced into separate multilayered capacitors. As example stack 740 of patterned films 725 and 735 prior to dicing is shown in FIG. 7C. Finally, the diced multilayered capacitors are heated to fuse the ceramic dielectric layers in a step 720 to complete the manufacture. The resulting multilayered capacitors may then be positioned and adhered onto corresponding substrates. Some example electronic systems that may advantageously incorporate a multilayered capacitor in accordance with the disclosure will now be discussed.

Example Electronic Systems

Figure 8:
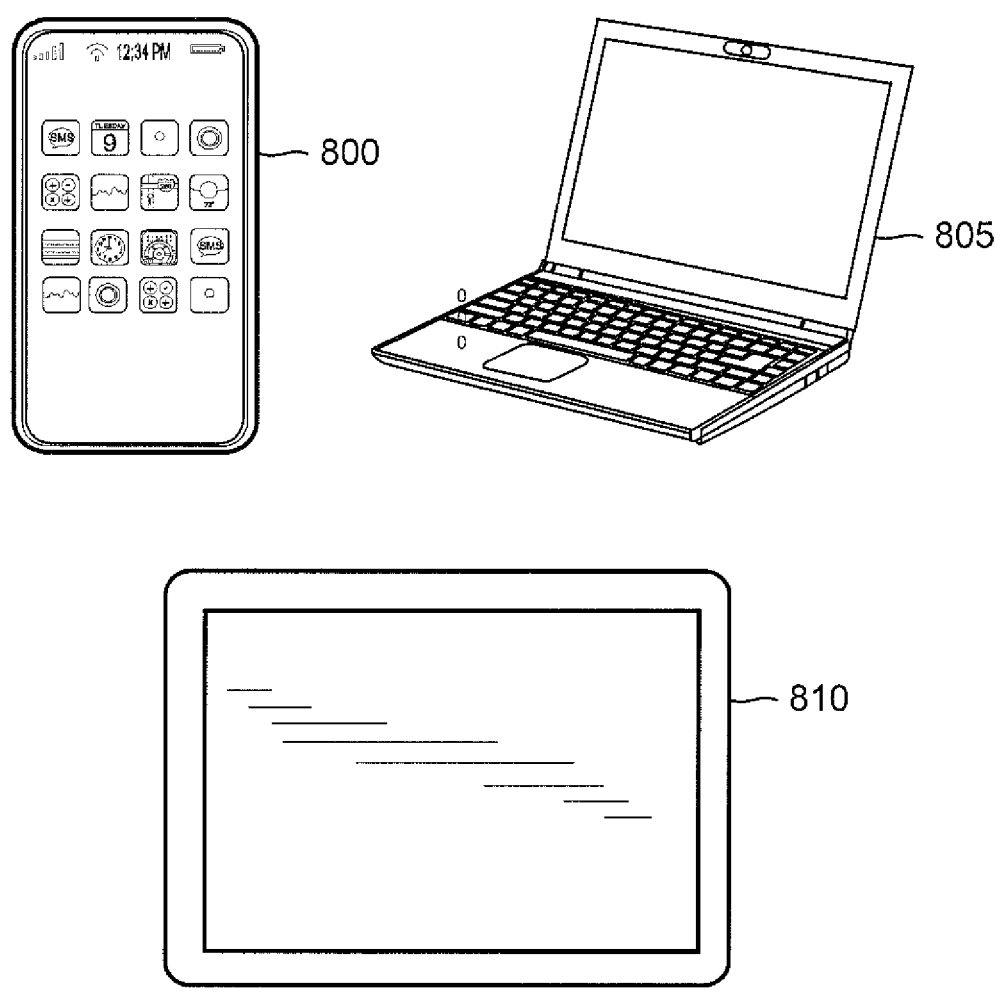
FIG. 8 illustrates some example electronic systems incorporating an integrated circuit package including a multilayer capacitor in accordance with an embodiment of the disclosure.

Integrated circuit packages including a multilayer capacitor as disclosed herein may be incorporated into a wide variety of electronic systems. For example, as shown in FIG. 8, a cell phone 800, a laptop 805, and a tablet PC 810 may all include an integrated circuit package incorporating a multilayered capacitor constructed in accordance with the disclosure. Other exemplary electronic systems such as a music player, a video player, a communication device, and a personal computer may also be configured with integrated circuit packages constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:
1. A multilayer capacitor, comprising
a plurality of first metal layers;

a plurality of second metal layers interleaved in a stack with the first metal layers such that the first and second metal layers alternate in the stack;

a plurality of dielectric layers interleaved in the stack such that each interleaved dielectric layer extends from an adjacent one of the first metal layers to an adjacent one of the second metal layers;

a plurality of vias extending through the stack, each via being configured to receive an interconnect, wherein the plurality of first metal layers are configured to project into a first subset of the vias, and wherein the plurality of second metal layers are configured to project into a second subset of the vias.

2. The multilayer capacitor of claim 1, wherein the dielectric layers comprise ceramic layers and the metal layers comprise copper metal layers.

3. The multilayer capacitor of claim 1, wherein the first subset of vias are configured to receive ground interconnects, and wherein the second subset of vias are configured to receive power supply interconnects.

4. The multilayer capacitor of claim 1, wherein the vias include a third subset of vias, and wherein each of the first and second metal layers is configured to not project into the third set of vias.

5. The multilayer capacitor of claim 1, wherein each first metal layer includes a plurality of ribs that extend into the first plurality of vias, and wherein each second metal layer includes a plurality of ribs that extend into the second plurality of vias.

6. The multilayer capacitor of claim 1, further comprising a die coupled to a plurality of interconnects corresponding to the plurality of vias, wherein each via receives a corresponding one of the interconnects.

7. The multilayer capacitor of claim 6, further comprising a substrate including a plurality of pads corresponding to the plurality of interconnects, wherein each pad couples to the corresponding interconnect, and wherein a combination of the die, the multilayer capacitor, and the substrate comprises an integrated circuit package.

8. The multilayer capacitor of claim 7, wherein the integrated circuit package is incorporated into at least one of a cellphone, a laptop, a tablet, a music player, a communication device, a computer, and a video player.

9. The multilayer capacitor of claim 6, wherein the substrate comprises a package substrate.

10. The multilayer capacitor of claim 6, wherein the substrate comprises a circuit board.

11. The multilayer capacitor of claim 1, wherein the stack has a thickness of less than 100 microns.

12. The multilayer capacitor of claim 1, wherein each metal layer includes a trench separating a portion of the vias from a remaining portion of the vias.

13. A method, comprising;
providing a metal layer onto a dielectric layer to form a metal layer/dielectric layer film;
forming a plurality of vias in the metal layer to provide a patterned film, wherein the metal layer is configured to project into a subset of the vias; and
stacking the patterned films and dicing the patterned films to form separate multilayer capacitors.

14. The method of claim 13, further comprising forming a plurality of vias in the dielectric layer prior to providing the metal layer.

15. The method of claim 13, wherein providing the metal layer comprises electroplating the metal layer onto the dielectric layer.

16. The method of claim 13, wherein the dielectric layer comprises a powdered ceramic material, the method further comprising fusing the multilayer capacitors to fuse the powered ceramic material.

* * * * *